(12) United States Patent
Yang

(10) Patent No.: US 11,049,535 B2
(45) Date of Patent: Jun. 29, 2021

(54) MEMORY DEVICE AND METHOD OF OPERATING THE MEMORY DEVICE

(71) Applicant: SK hynix Inc., Icheon-si (KR)

(72) Inventor: Chul Woo Yang, Yongin-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/853,337

(22) Filed: Apr. 20, 2020

(65) Prior Publication Data

US 2021/0090620 A1 Mar. 25, 2021

(30) Foreign Application Priority Data

Sep. 23, 2019 (KR) .................. 10-2019-0116755

(51) Int. Cl.
*G06F 12/02* (2006.01)
*G11C 7/12* (2006.01)
*G11C 7/10* (2006.01)

(52) U.S. Cl.
CPC ............... *G11C 7/12* (2013.01); *G11C 7/106* (2013.01); *G11C 7/1057* (2013.01); *G11C 7/1084* (2013.01); *G11C 7/1087* (2013.01)

(58) Field of Classification Search
CPC ......... G11C 7/12; G11C 7/1057; G11C 7/106; G11C 7/1084; G11C 7/1087

USPC ....................................................... 365/207
See application file for complete search history.

(56) References Cited

U.S. PATENT DOCUMENTS 7,123,521 B1    10/2006  Louie et al.
2015/0378887 A1*  12/2015  Lee .................. G11C 7/1039
                                                711/103

FOREIGN PATENT DOCUMENTS

KR         101468886 B1    12/2014

* cited by examiner

*Primary Examiner* — Xiaochun L Chen
(74) *Attorney, Agent, or Firm* — William Park & Associates Ltd.

(57) ABSTRACT

A page buffer includes a bit line sensing circuit, a latch, and a main latch for sensing and storing data from a memory cell. The bit line sensing circuit is coupled with the memory cell by a bit line and configured to perform a bit line sensing operation of sensing first data stored in the memory cell. The latch control circuit is coupled with the bit line sensing circuit. The main latch is coupled with the bit line sensing circuit through the latch control circuit and configured to perform a main latch operation of storing the sensed first data. The cache latch is coupled with the main latch and configured to perform a cache latch operation of storing second data stored in the main latch. Wherein a period of time of the cache latch operation overlaps with a period of time of the bit line sensing operation.

21 Claims, 12 Drawing Sheets

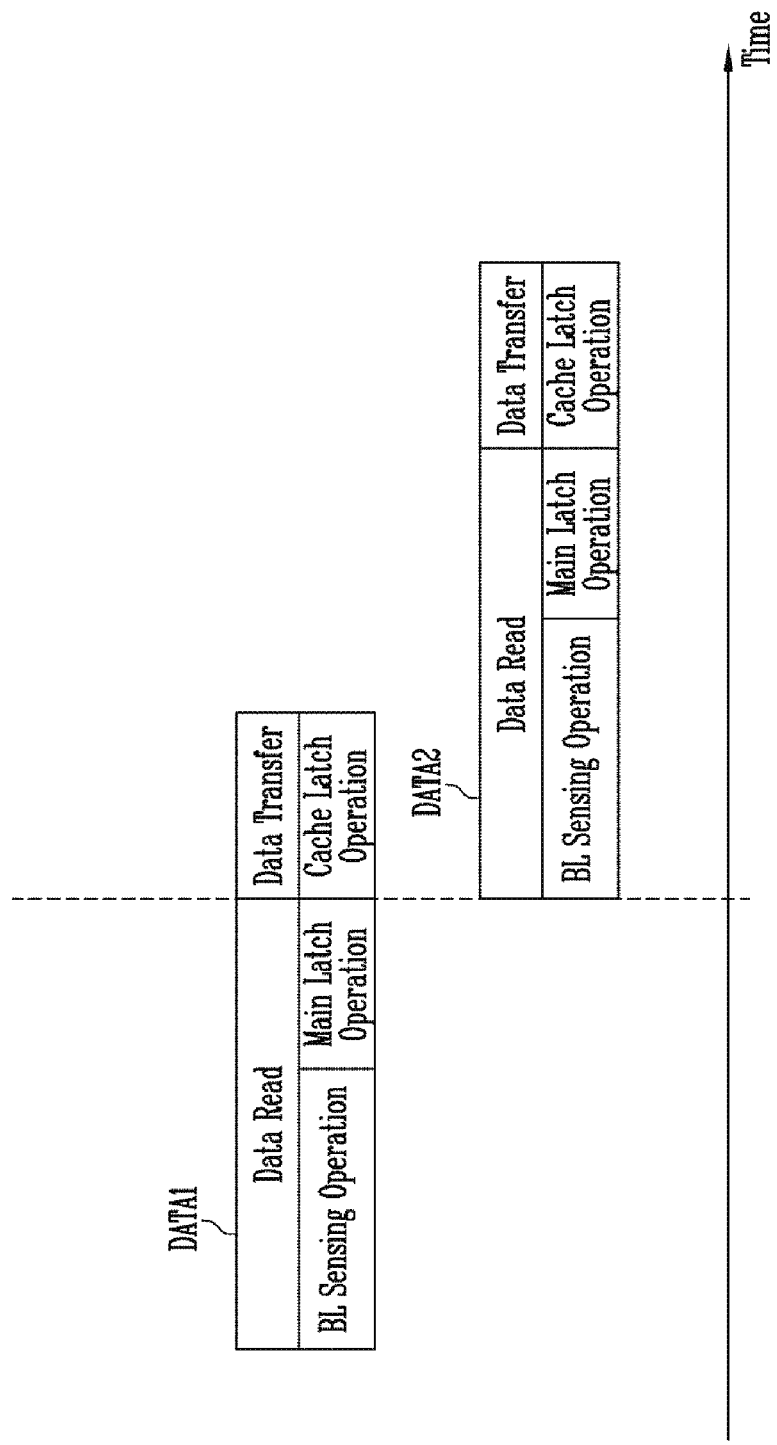

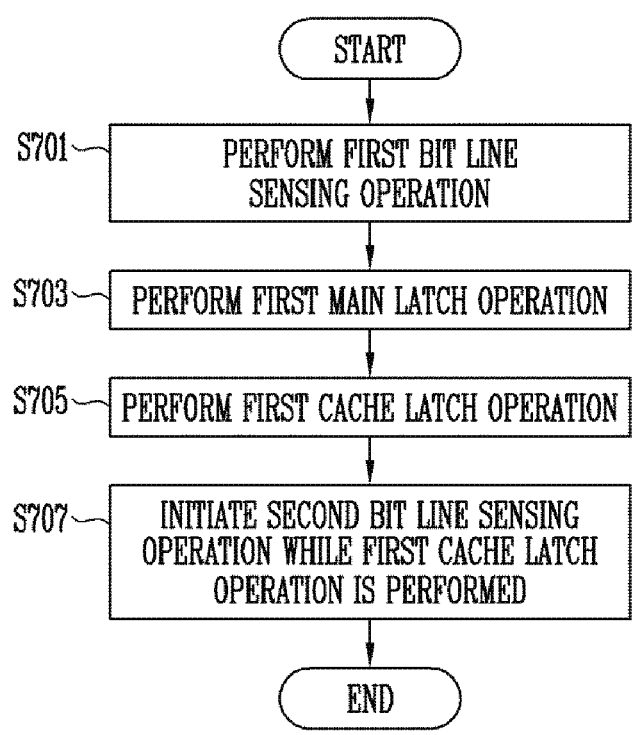

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2019-0116755 filed on Sep. 23, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

Generally, a storage device is a device which stores data under control of a host device such as a computer or a smartphone. The storage device may include a memory device configured to store data, and a memory controller configured to control the memory device. Memory devices are chiefly classified into volatile memory devices and nonvolatile memory devices.

A nonvolatile memory device is a memory device in which data stored therein is maintained even when power is turned off. The nonvolatile memory device may include memory cells, and perform a program operation of storing data in the memory cells, a read operation of reading the stored data, and an erase operation of erasing the stored data.

A page buffer may include latches coupled with the memory cells by bit lines and configured to store data read from the memory cells. The latches of the page buffer may be divided into a main latch and a cache latch to perform a cache read operation.

SUMMARY

An embodiment of the present disclosure may provide for a page buffer including a bit line sensing circuit, a latch control circuit, a main latch, and a cache latch. The bit line sensing circuit may be coupled with a memory cell by a bit line and configured to perform a bit line sensing operation of sensing first data stored in the memory cell. The latch control circuit may be coupled with the bit line sensing circuit. The main latch may be coupled with the bit line sensing circuit through the latch control circuit and configured to perform a main latch operation of storing the sensed first data. The cache latch may be coupled with the main latch and configured to perform a cache latch operation of storing second data stored in the main latch. The latch control circuit may control connection of the bit line sensing circuit with the main latch so that a period of time of the cache latch operation overlaps with a period of time of the bit line sensing operation.

An embodiment of the present disclosure may provide for a memory device including a memory cell array, a first buffer, a second buffer, and a read operation controller. The memory cell array may include a plurality of memory cells. The first buffer may sense and store data stored in the plurality of memory cells. The second buffer may store data transmitted from the first buffer. The read operation controller may control the first buffer to perform a data read operation of sensing and storing first data stored in first memory cells among the plurality of memory cells, and control the first buffer and the second buffer such that a period of time of the data read operation overlaps with a period of time of a data transfer operation of storing, in the second buffer, second data stored in the first buffer.

An embodiment of the present disclosure may provide for a memory device including a memory cell array, a first buffer, a second buffer, and a read operation controller. The memory cell array may include a plurality of memory cells. The first buffer may sense and store data stored in the plurality of memory cells. The second buffer may store data transmitted from the first buffer. The read operation controller may control the first buffer and the second buffer such that a first data read operation of storing, in the first buffer, first data stored in first memory cells among the plurality of memory cells and a first data transfer operation of storing, in the second buffer, the first data stored in the first buffer are performed in response to a first read command, and a second data read operation of storing, in the first buffer, second data stored in second memory cells among the plurality of memory cells is performed in response to a second read command. Some period of time of the first data transfer operation may overlap with some period of time of the second data read operation.

BRIEF DESCRIPTION OF THE DRAWINGS

FIG. 6 is a diagram for describing a cache read operation in accordance with an embodiment.

FIG. 7 is a flowchart for describing an operation of the page buffer in accordance with an embodiment.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Hereinafter, the present disclosure will be explained in detail by describing examples of embodiments of the present disclosure with reference to the accompanying drawings.

Hereinafter, embodiments of the present disclosure will be described in detail with reference to the attached drawings.

Various embodiments of the present disclosure may be directed to a memory device having improved cache read performance, and a method of operating the memory device.

Figure 1:
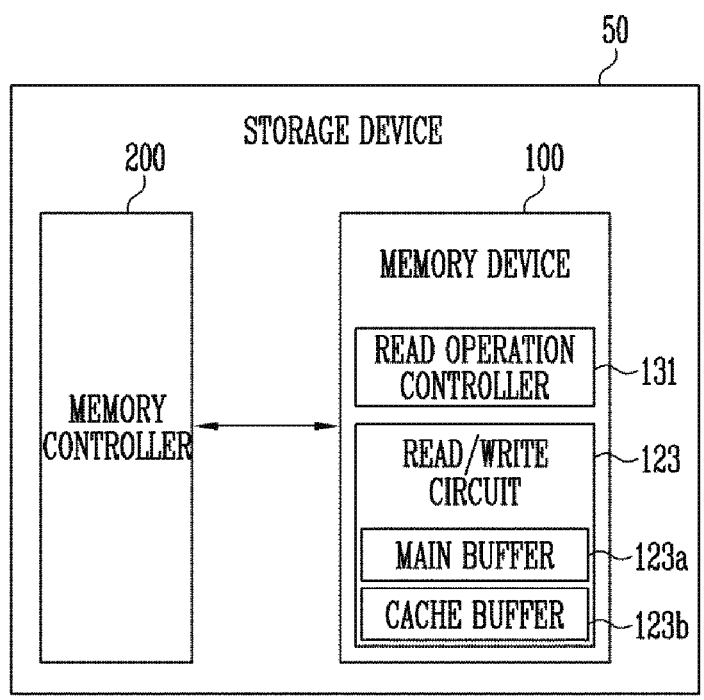
FIG. 1 is a diagram illustrating a storage device in accordance with an embodiment of the present disclosure.

FIG. 1 is a diagram illustrating a storage device 50 in accordance with an embodiment of the present disclosure.

Referring to FIG. 1, the storage device 50 may include a memory device 100 and a memory controller 200 configured to control the operation of the memory device 100. The storage device 50 may be a device configured to store data under control of a host such as a cellular phone, a smartphone, an MP3 player, a laptop computer, a desktop computer, a game machine, a TV, a tablet PC, or an in-vehicle infotainment system.

The storage device 50 may be manufactured as any one of various kinds of storage devices depending on a host interface, which is a communication system for communicating with the host. For example, the data storage device 50 may be configured of any one of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data in the memory cells.

The memory cells may include a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. Each memory block may include a plurality of pages. In an embodiment, each page may be the unit of sorting data in the memory device 100 or reading stored data from the memory device 100.

Each memory block may be the unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may receive a command and an address from the memory controller 200 and access an area of the memory cell array that is selected by the address. In other words, the memory device 100 may perform an operation instructed by the command on the area selected by the address. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In an embodiment, the memory device 100 may include a read/write circuit 123 and a read operation controller 131. The read/write circuit 123 may include a main buffer 123a and a cache buffer 123b.

The main buffer 123a may sense and store data stored in the memory cells of the memory cell array. The cache buffer 123b may receive and store the data stored in the main buffer 123a. The cache buffer 123b may output the stored data to the memory controller 200.

The read operation controller 131 may control the main buffer 123a and the cache buffer 123b to perform a read operation in response to a read command provided from the memory controller 200.

For example, the read operation controller 131 may control the main buffer 123a to perform a data read operation of sensing and storing data stored in a plurality of memory cells. The read operation controller 131 may control the main buffer 123a and the cache buffer 123b to perform a data transfer operation of storing, in the cache buffer 123b, the data stored in the main buffer 123a. The read operation controller 131 may control the cache buffer 123b to output the data stored in the cache buffer 123b to the memory controller 200.

For example, the read operation controller 131 may control the main buffer 123a to perform, in response to a first read command, a first data read operation of sensing and storing first data stored in first memory cells among the plurality of memory cells. The read operation controller 131 may control the main buffer 123a and the cache buffer 123b to perform a first data transfer operation of storing, in the cache buffer 123b, the first data stored in the main buffer 123a. The read operation controller 131 may control the cache buffer 123b to perform a first data output operation of outputting the first data stored in the cache buffer 123b to the memory controller 200.

The read operation controller 131 may control the main buffer 123a to perform, in response to a second read command, a second data read operation of sensing and storing second data stored in second memory cells among the plurality of memory cells. The read operation controller 131 may control the main buffer 123a and the cache buffer 123b to perform a second data transfer operation of storing, in the cache buffer 123b, the second data stored in the main buffer 123a. The read operation controller 131 may control the cache buffer 123b to perform a second data output operation of outputting the second data stored in the cache buffer 123b to the memory controller 200.

The second read command may be a cache read command for instructing to perform a cache read operation. The cache read operation may simultaneously perform an operation of reading data stored in the memory cell array to the page buffer and an operation of outputting the data stored in the page buffer to the memory controller. The words "simultaneous" and "simultaneously" as used herein with respect to operations mean that the operations take place on overlapping intervals of time. For example, if a first operation takes place over a first interval of time and a second operation takes place simultaneously over a second interval of time, then the first and second intervals at least partially overlap each other such that there exists a time at which the first and second operations are both taking place. For example, there exists a time interval during which both operations are being performed. Therefore, some period of time of the cache read operation corresponding to the second read command may overlap with some period of time of a read operation corresponding to the first read command.

In an embodiment, the read operation controller 131 may control the main buffer 123a and the cache buffer 123b such that some period of time of the first data output operation and some period of time of the second data read operation overlap with each other. The read operation controller 131 may control the main buffer 123a and the cache buffer 123b such that some period of time of the first data transfer operation and some period of time of the second data read operation overlap with each other.

In other words, the read operation controller 131 may control the main buffer 123a and the cache buffer 123b such that, while the cache buffer 123b performs the first data transfer operation of receiving and storing first data stored in the main buffer 123a, the main buffer 123a initiates the second data read operation of sensing and storing second data stored in second memory cells. For example, there exists a time interval during which both the first data transfer operation and the second data read operation are being performed.

The memory controller 200 may control overall operations of the storage device 50.

When power is applied to the storage device 50, the memory controller 200 may execute firmware (FW). In the case where the memory device 100 is a flash memory device, the memory controller 200 may execute firmware such as a flash translation layer (FTL) for controlling communication between the host and the memory device 100.

In an embodiment, the memory controller 200 may receive data and a logical block address (LBA) from the host, and translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a command, an address and data without a request from the host, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 in an interleaving manner to enhance the operating performance. The interleaving scheme may be an operating scheme of overlapping operating periods of at least two or more memory devices 100.

Figure 2:
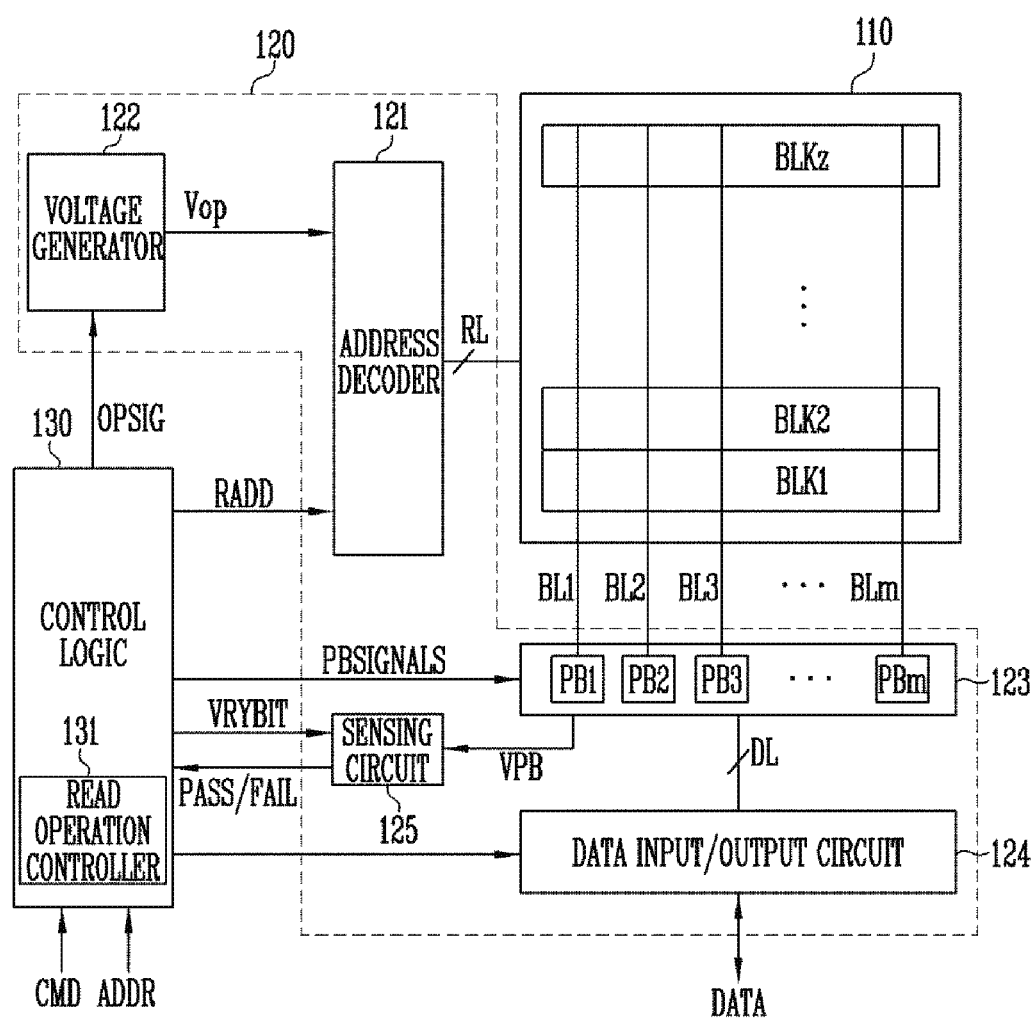
FIG. 2 is a diagram illustrating the configuration of a memory device of FIG. 1.

FIG. 2 is a diagram illustrating the configuration of the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks BLK1 to BLKz. The plurality of memory blocks BLK1 to BLKz are coupled to the address decoder 121 through row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 may be formed of a plurality of physical pages. In an embodiment, each of the memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device 100 may be formed of a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

In an embodiment, the row lines RL may be local lines included in local line groups. Each local line group may correspond to one memory block. The local line group may include a drain select line, local word lines, and a source select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address RADD among the received addresses ADDR. The address decoder 121 may select at least one word line WL of the selected memory block by applying voltages supplied from the voltage generator 122 to at least one word line WL according to the decoded row address RADD.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages required from the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, to generate a plurality of operating voltages Vop having various voltage levels, a plurality of pumping capacitors configured to receive an internal supply voltage, and may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under control of the control logic 130.

The first to m-th page buffers PB1 to PBm may communicate data DATA with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA in the first to m-th page buffers PB1 to PBm.

During an erase operation, the read/write circuit 123 may float the bit lines BL. In an embodiment, the read/write circuit 123 may include a column select circuit.

In an embodiment, the read/write circuit 123 may include a main buffer (not illustrated) and a cache buffer (not illustrated). The main buffer may store data DATA read from memory cells. The cache buffer may receive and store data stored in the main buffer. The cache buffer may output the stored data to the data input/output circuit 124 through the data line DL.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) for receiving input data DATA. During a program operation, the data input/output circuit 124 may receive data DATA to be stored from an external controller (not shown). During a read operation, the data input/output circuit 124 may output, to the external controller, the data DATA received from the first to m-th page buffers PB1 to PBm included in the read/write circuit 123.

During a read operation or a verify operation, the sensing circuit 125 may generate reference current in response to an enable bit signal VRYBIT generated by the control logic 130, compare a sensing voltage VPB received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operation of the memory device 100. The control logic 130 may operate in response to a command CMD transmitted from an external device.

The control circuit 130 may generate various signals in response to the command CMD and the address ADD and control the peripheral circuit 120. For example, the control logic 130 may generate an operating signal OPSIG, a row address RADD, a read/write circuit control signal PBSIGNALS, and an enable bit VRYBIT in response to the command CMD and the address ADD. The control logic 130 may output the operating signal OPSIG to the voltage generator 122, output the row address RADD to the address decoder 121, output the read/write control signal to the read/write circuit 123, and output the enable bit VRYBIT to the sensing circuit 125. The control logic 130 may determine whether target memory cells have passed or failed a verification during the verify operation in response to a pass signal PASS or a fail signal FAIL that is output from the sensing circuit 125.

In an embodiment, the control logic 130 may include a read operation controller 131. The read operation controller 131 may control the peripheral circuit 120 such that the peripheral circuit 120 reads data stored in the memory cell array 110 and outputs the read data to the external controller in response to an input command CMD and an address ADDR.

The read operation controller 131 may control main buffer to perform a data read operation of storing the data read from the memory cell array 110 in the main buffer. The read operation controller may control the main buffer and the cache buffer to perform a data transfer operation of storing, in the cache buffer, the data in the main buffer.

In an embodiment, the read operation controller 131 may control the main buffer and the cache buffer to initiate a data read operation for second data while a data transfer operation for first data is performed. The first data may be data that has been stored in the main buffer before the data read operation for the second data is performed.

For example, the read operation controller 131 may control the main buffer and the cache buffer such that some period of time of the data transfer operation for the first data overlaps with some period of time of the data read operation for the second data. For example, there exists a time interval during which both the data transfer operation for the first data and the data read operation for the second data are being performed.

Figure 3:
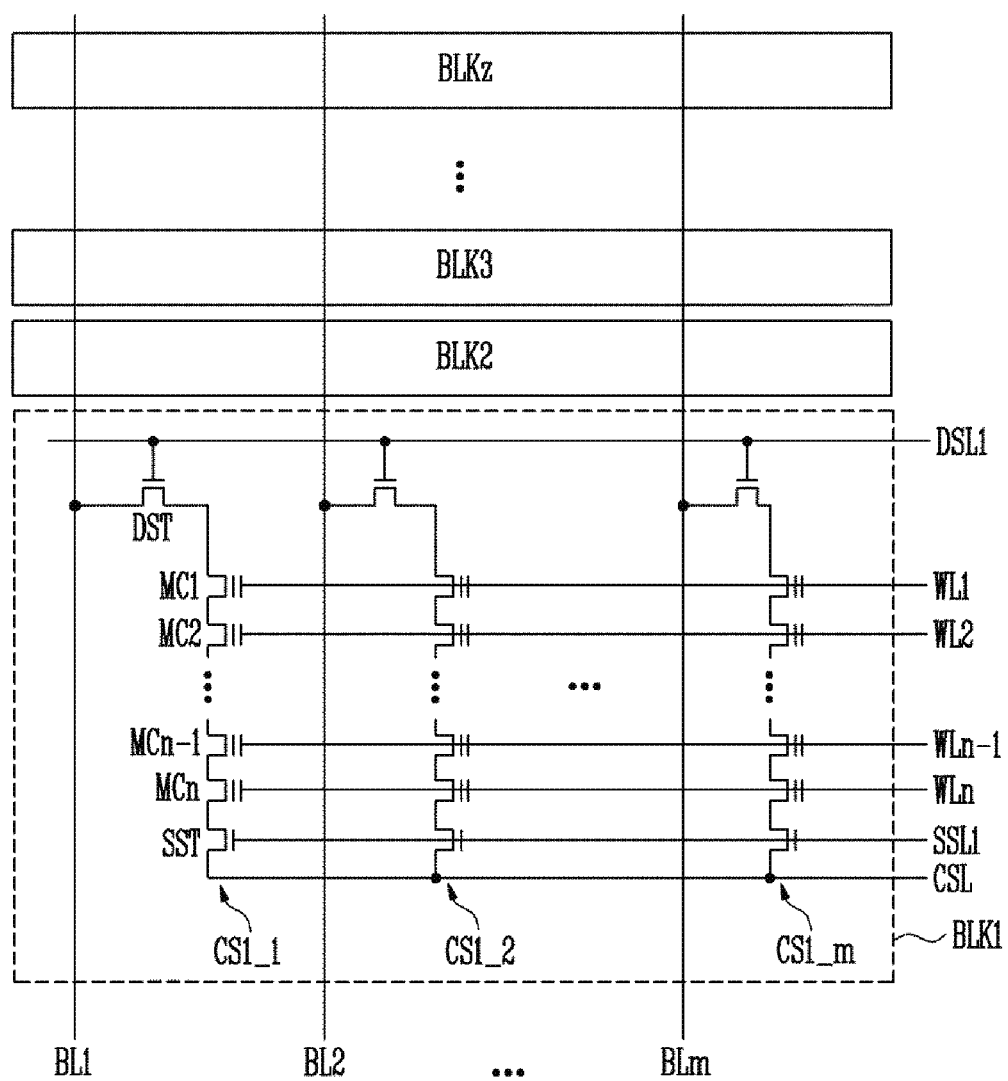
FIG. 3 is a diagram illustrating a memory cell array of FIG. 2 in accordance with an embodiment.

FIG. 3 is a diagram illustrating the memory cell array 110 of FIG. 2 in accordance with an embodiment.

Referring to FIG. 3, the first to z-th memory blocks BLK1 to BLKz are connected in common to the first to m-th bit lines BL1 to BLm. In FIG. 3, for the sake of explanation, elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 may include a plurality of cell strings CS1_1 to CS1_m (m is a positive integer). The first to m-th cell strings CS1_1 to CS1_m are respectively coupled to the first to m-th bit lines BL1 to BLm. Each of the first to m-th cell strings CS1_1 to CS1_m includes a drain select transistor DST, a plurality of memory cells MC1 to MCn (n is a positive integer) coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are respectively coupled to the first to n-th word lines WL1 to WLn. A gate terminal of the source select transistor SST included in each of the first to m-th cell strings CS1_1 to CS1_m is coupled to a source select line SSL1.

For the sake of explanation, the configuration of each cell string will be described based on the first cell string CS1_1 of the plurality of cell strings CS1_1 to CS1_m. It will be understood that each of the other cell strings CS1_1 to CS1_m has the same configuration as that of the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn are coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read/write circuit 123.

Figure 4:
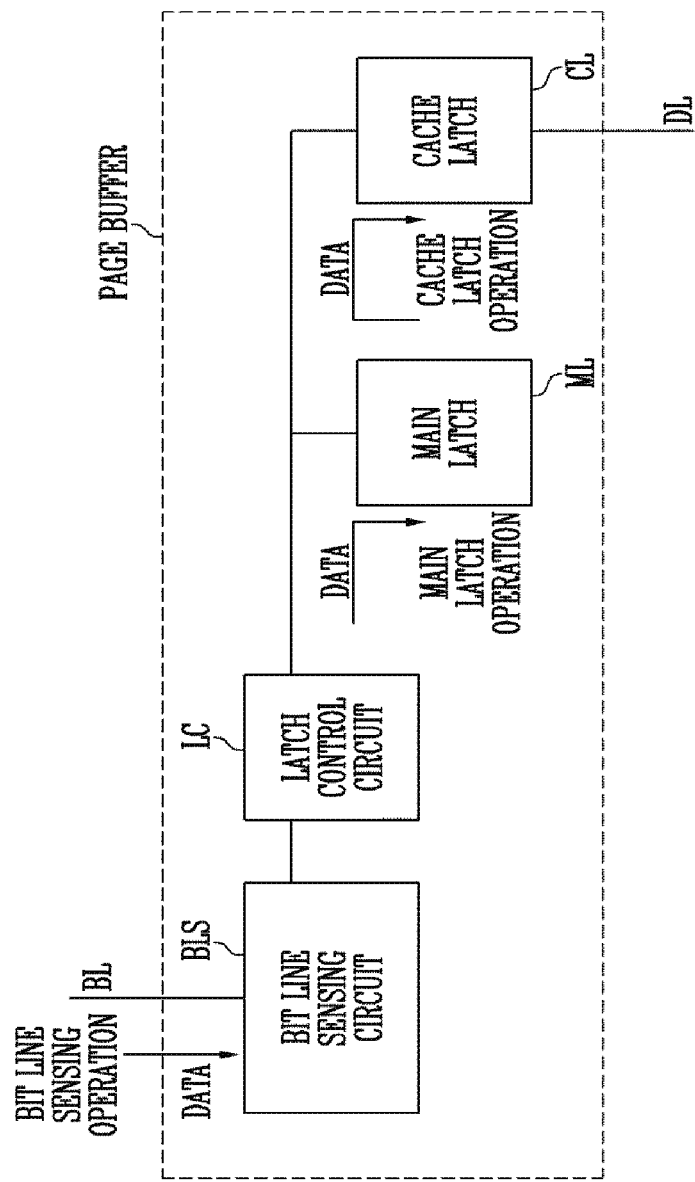
FIG. 4 is a diagram illustrating a page buffer of FIG. 3 in accordance with an embodiment.

FIG. 4 is a diagram illustrating a page buffer of FIG. 3 in accordance with an embodiment.

Referring to FIG. 4, the page buffer may include a bit line sensing circuit BLS, a latch control circuit LC, a main latch ML, and a cache latch CL.

The bit line sensing circuit BLS may perform a bit line sensing operation of sensing data stored in a memory cell through a bit line BL. The latch control circuit LC may be connected between the bit line sensing circuit BLS and the main latch ML and retain or interrupt the connection between the bit line sensing circuit BLS and the main latch ML. The main latch ML may perform a main latch operation of storing data sensed by the bit line sensing circuit BLS. The cache latch CL may perform a cache latch operation of receiving and storing the data stored in the main latch ML.

In an embodiment, some period of time of the cache latch operation and some period of time of the bit line sensing operation may overlap with each other. For example, there exists a time interval during which both the cache latch operation and the bit line sensing operation are being performed.

For example, the bit line sensing circuit BLS may initiate the bit line sensing operation while the cache latch operation is performed. The latch control circuit LC may interrupt the connection between the bit line sensing circuit BLS and the main latch ML during a period of time in which the bit line sensing operation and the cache latch operation overlap with each other. The latch control circuit LC may reconnect the bit line sensing circuit BLS and the main latch ML to each other when the cache latch operation has completed. In some embodiments, the latch control circuit LC may reconnect the bit line sensing circuit BLS and the main latch ML to each other when the cache latch operation has paused or ended before completion.

Figure 5A:
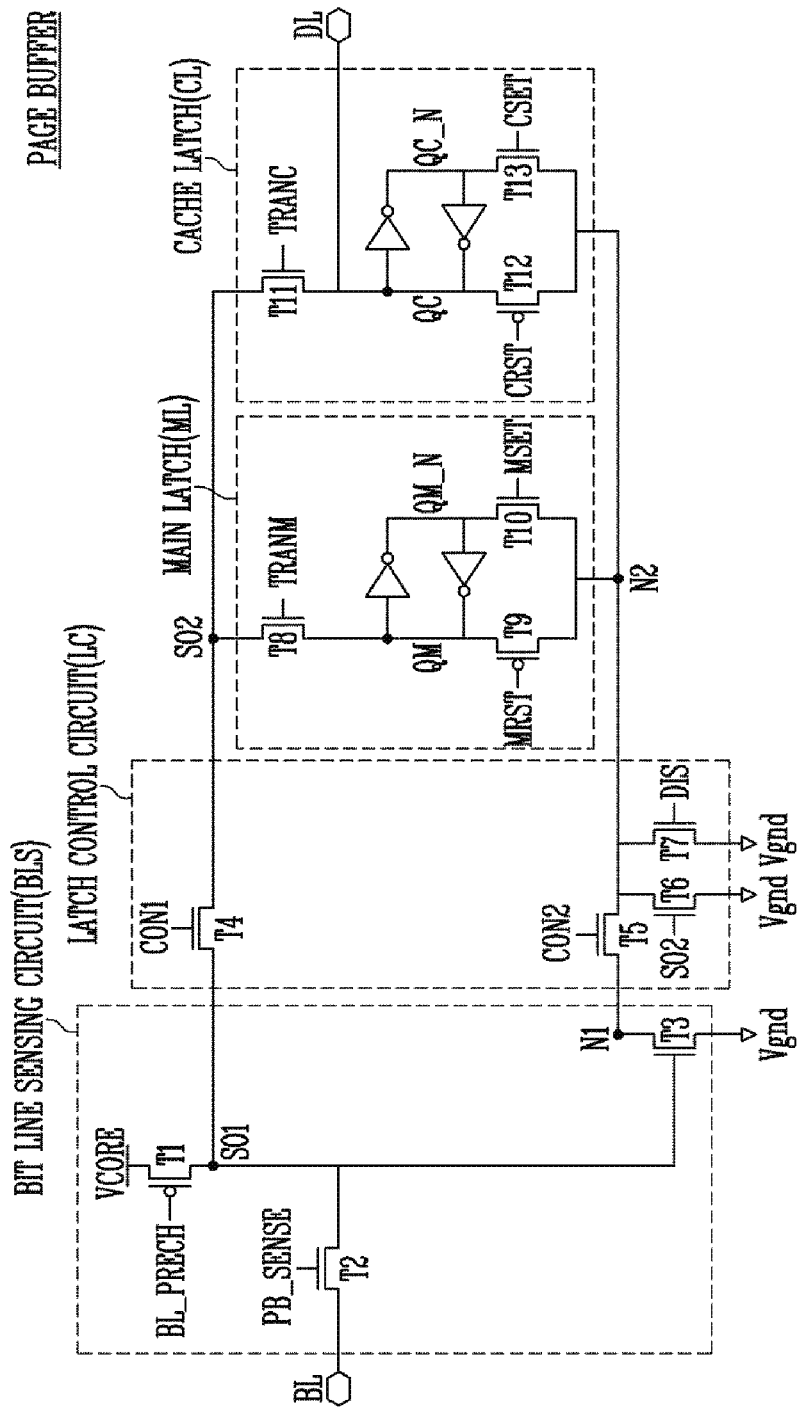
FIG. 5A is a diagram illustrating the page buffer of FIG. 4.

FIG. 5A is a diagram illustrating in detail the page buffer of FIG. 4.

Referring to FIG. 5A, the bit line sensing circuit BLS may perform a data read operation of sensing data stored in a memory cell coupled with the corresponding bit line BL. The sensed data may be stored in the main latch ML.

The latch control circuit LC may connect the bit line sensing circuit BLS with the main latch ML. The latch control circuit LC may connect the bit line sensing circuit BLS with the cache latch CL. The latch control circuit LC may retain or interrupt the connection between the bit line sensing circuit BLS and the main latch ML. The latch control circuit LC may retain or interrupt the connection between the bit line sensing circuit BLS and the cache latch CL.

The main latch ML may perform a main latch operation of storing data sensed by the bit line sensing circuit BLS.

The cache latch CL may perform a cache latch operation of receiving and storing the data stored in the main latch ML. An operation of transmitting the data stored in the main latch ML to the cache latch CL and storing the data in the cache latch CL may be a data transfer operation. The cache latch CL may perform a data output operation of outputting, through the data line DL, the data stored in the cache latch CL to an external device provided outside the page buffer.

In an embodiment, the bit line sensing circuit BLS may include first to third transistors T1 to T3.

The first transistor T1 may be coupled between a power supply voltage node VCORE and a first sensing node SO1. The first transistor T1 may be controlled by a bit line pre-charge signal BL_PRECH. The second transistor T2 may be coupled between the bit line BL and the first sensing node SO1. The second transistor T2 may be controlled by a page buffer control signal PB_SENSE. The third transistor T3 may be coupled between a ground voltage node Vgnd and a first node N1. The third transistor T3 may be controlled by potential of the first sensing node SO1.

The number, the type, and the connection relationship of transistors included in the bit line sensing circuit BLS, and signals for controlling the transistors are not limited to those of the present embodiments.

In an embodiment, the latch control circuit LC may include fourth to seventh transistors T4 to T7. The fourth transistor T4 may be a first switch coupled between the first sensing node SO1 and a second sensing node SO2. The fourth transistor T4 may be controlled by a first connection signal CON1. The fifth transistor T5 may be a second switch coupled between the first node N1 and a second node N2. The fifth transistor T5 may be controlled by a second connection signal CON2. The sixth transistor T6 may be coupled between the second node N2 and the ground voltage node Vgnd. The sixth transistor T6 may be controlled by potential of the second sensing node SO2. The seventh transistor T7 may be coupled between the second node N2 and the ground voltage node Vgnd. The seventh transistor T7 may be controlled by a discharge signal DIS. The discharge signal DIS may be a control signal for resetting the main latch or the cache latch.

The number, the type, and the connection relationship of transistors included in the latch control circuit LC, and signals for controlling the transistors are not limited to those of the present embodiments.

In an embodiment, the main latch ML may include eighth to tenth transistors T8 to T10 and two inverter circuits. The eighth transistor T8 may be coupled between the second sensing node SO2 and a node QM. The eighth transistor T8 may be controlled by a main latch control signal TRANM. Two inverters oriented in directions opposite to each other may be coupled in parallel between the node QM and a node QM_N. The node QM and the node QM_N may have values inverted to each other. The ninth transistor T9 may be coupled between the node QM and the second node N2. The ninth transistor T9 may be controlled by a main latch reset signal MRST. The tenth transistor T10 may be coupled between the node QM_N and the second node N2. The tenth transistor T10 may be controlled by a main latch set signal MSET.

The number, the type, and the connection relationship of transistors included in the main latch ML, and signals for controlling the transistors are not limited to those of the present embodiments.

In an embodiment, the cache latch CL may include eleventh to thirteenth transistors T11 to T13 and two inverter circuits. The eleventh transistor T11 may be coupled between the second sensing node SO2 and a node QC. The eleventh transistor T11 may be controlled by a cache latch control signal TRANC. Two inverters oriented in directions opposite to each other may be coupled in parallel between the node QC and a node QC_N. The node QC and the node QC_N may have values inverted from each other. The node QC may be coupled with the data line DL. The twelfth transistor T12 may be coupled between the node QC and the second node N2. The twelfth transistor T12 may be controlled by a cache latch reset signal CRST. The thirteenth transistor T13 may be coupled between the node QC_N and the second node N2. The thirteenth transistor T13 may be controlled by a cache latch set signal CSET. The number, the type, and the connection relationship of transistors included in the cache latch CL, and signals for controlling the transistors are not limited to those of the present embodiments.

In an embodiment, if the potential of a node is at a high level, the logical value of the node may be '1'. If the potential of the node is at a low level, the logical value of the node may be '0'. In an embodiment, if the potential of a node is at the high level, the logical value of the node may be '0'. If the potential of the node is at the low level, the logical value of the node may be '1'. In an embodiment, depending on a control signal applied to a gate of a transistor, the transistor may be turned on or off. If the control signal is enabled, the transistor may be turned on. If the control signal is disabled, the transistor may be turned off.

A bit line sensing operation may be an operation of sensing data stored in a memory cell. During some period of time of the bit line sensing operation overlapping with some period of time of a cache latch operation to be described below, the electrical connection between the bit line sensing circuit BLS and the main latch ML may be interrupted by the first switch T4 and the second switch T5 during these overlapping periods of time.

The bit line sensing operation may include a bit line pre-charge operation and an evaluation operation. The bit line pre-charge operation may be an operation of pre-charging the potential of the bit line BL to a high level.

If a bit line pre-charge signal BL_PRECH is enabled, the first transistor T1 is turned on, and the power supply voltage node VCORE is coupled with the first sensing node SO1. Hence, the potential of the first sensing node SO1 may be pre-charged to a high level. If a page buffer control signal PB_SENSE is enabled, the second transistor T2 is turned on, and the first sensing node SO1 is coupled with the bit line BL. Therefore, the potential of the bit line BL may be pre-charged to a high level. If the bit line pre-charge operation is completed, the bit line pre-charge signal BL_PRECH may be disabled, and the connection between the power supply voltage node VCORE and the first sensing node SO1 may be interrupted.

The evaluation operation may be an operation of retaining or discharging, depending on data stored in the memory cell, the potential of the first sensing node SO1 pre-charged to the high level.

In an embodiment, when the memory cell is a single-level cell SLC, a logical value of data stored in a memory cell may be '0' if the memory cell is an on-cell, and may be '1' if the memory cell is an off-cell. In an embodiment, if the memory cell is an on-cell, the logical value of the data stored in the memory cell may be '1'. If the memory cell is an off-cell, the logical value of the data stored in the memory cell may be '0'. The on-cell may be a memory cell the threshold voltage of which is lower than a read voltage. The off-cell may be a memory cell the threshold voltage of which is higher than the read voltage.

Referring to FIG. 3, a memory cell string including a selected memory cell may be coupled with the corresponding bit line BL by the corresponding drain select transistor DST. The memory cell string may be coupled with the common source line CSL by the corresponding source select transistor SST. When the drain select transistor DST and the source select transistor SST are turned on, bit line current may flow depending on whether the selected memory cell is an on-cell or off-cell. For example, if the selected memory cell is an on-cell, bit line current flows from the bit line BL to the memory cell string, and the potential of the first sensing node SO1 coupled with the bit line BL may be discharged to a low level. If the selected memory cell is an off-cell, bit line current does not flow, and the potential of the first sensing node SO1 may remain at the high level.

During the evaluation operation, the drain select transistor DST and the source select transistor SST may be turned on. If a page buffer control signal PB_SENSE is enabled during the evaluation operation, the second transistor T2 is turned on, and the first sensing node SO1 is coupled with the bit line BL. Therefore, the potential of the first sensing node SO1 may remain at the high level or be discharged to the low level depending on the bit line current. In other words, the potential of the first sensing node SO1 may be determined depending on data stored in the memory cell. Since the number of components (DST, MC, SST, etc.) coupled with the bit line BL is relatively large compared to the number of components coupled with the first sensing node SO1, a capacitance value of the bit line BL may be comparatively large. Therefore, when bit line current occurs, a reduction width of the potential of the bit line BL is slight compared to a reduction width of the potential of the first sensing node SO1. The third transistor T3 may be turned on or off depending on the potential of the first sensing node SO1. If the logical value of the first sensing node SO1 is '1', the third transistor T3 may be turned on, and the potential of the first node N1 may become a ground voltage Vgnd. The logical value of the first node N1 may be '0'. If the logical value of the first sensing node SO1 is '0', the third transistor T3 may be turned off, and the first node N1 may float.

The main latch operation may be an operation of storing, in the main latch ML, data sensed from the memory cell by the bit line sensing circuit BLS. The main latch operation may include a main latch reset operation and a main latch set operation.

The main latch reset operation may be an operation of resetting the logical value of the node QM to '0'. While the main latch reset operation is performed, the bit line sensing circuit BLS and the main latch ML may be electrically interrupted. In other words, the first and second switches T4 and T5 may be turned off. During the main latch reset operation, the main latch reset signal MRST and the discharge signal DIS may be enabled. Hence, the seventh and ninth transistors T7 and T9 may be turned on, and the node QM may be coupled with the ground voltage node Vgnd. A logical value of the node QM may be set to '0'. A logical value of the node QM_N may be set to '1' obtained by inverting the logical value of the node QM.

If the main latch reset operation is completed, the main latch set operation may be performed. The main latch set operation may be an operation of the logical value of the node QM to '0' or '1' depending on a result of performing the bit line sensing operation. While the main latch set operation is performed, the second switch T5 may be turned on, and the first node N1 and the second node N2 may be coupled with each other. While the main latch set operation is performed, the main latch set signal MRST may be enabled. If the main latch set signal MRST is enabled, the node QM_N may be coupled with the first node N1 via the tenth and the fifth transistors T10 and T5. The potential of the node QM_N may remain at the high level or be discharged to the low level, depending on the potential of the first sensing node SO1.

If the main latch set operation is completed, the logical value of the node QM may be set to the same value as the logical value of the first sensing node SO1. For example, if the logical value of the first sensing node SO1 is '1', the third transistor T3 is turned on, and the logical value of the node QM_N is set to '0'. The logical value of the node QM that has been '0' may be set to '1' obtained by inverting the logical value of the node QM_N. If the logical value of the first sensing node SO1 is '0', the third transistor T3 is turned off, and the first node N1 floats. Hence, the logical value of the node QM_N may remain at '1', and the logical value of the node QM may remain at '0'.

The cache latch operation may include a cache latch reset operation and a cache latch set operation. The cache latch reset operation may be performed in the same manner as that of the main latch reset operation. The cache latch set operation may be an operation of setting the logical value of the node QC to '0' or '1', depending on the logical value of the node QM that is data stored in the main latch.

During some of a period in which the cache latch set operation is performed, the first switch T4 may be turned on, and the first sensing node SO1 and the second sensing node SO2 may be electrically coupled with each other. If the bit line pre-charge operation and the cache latch set operation overlap with each other, the potential of the second sensing node SO2 coupled with the first sensing node SO1 may be pre-charged to the high level.

During the cache latch set operation, if the main latch control signal TRANM is enabled, the node QM may be coupled with the second sensing node SO2, and the logical value of the node QM may be transmitted to the second sensing node SO2. In other words, the logical value of the second sensing node SO2 may be set to the same value as the logical value of the node QM. If the cache latch set signal CSET is enabled, the node QC_N may be coupled with the second node N2. In various embodiment, the latch control circuit LC may include a third switch (not illustrated) that is controlled depending on the logical value of the node QM. The third switch may be coupled between the second sensing node SO2 and the ground voltage node Vgnd. The eighth transistor T8 may be coupled between a gate terminal of the third switch and the node QM rather than being between the second sensing node SO2 and the node QM. If the main latch control signal TRANM is enabled, the third switch may be controlled by the potential of the node QM. When it is assumed that the third switch is a PMOS transistor, the potential of the second sensing node SO2 that has been pre-charged to the high level may remain at the high level if the logical value of the node QM is '1'. If the logical value of the node QM is '0', the potential of the second sensing node SO2 that has been pre-charged to the high level may be discharged to the low level. Therefore, the logical value of the second sensing node SO2 may be set to the same value as the logical value of the node QM.

Therefore, if the logical value of the second sensing node SO2 is '1', the sixth transistor T6 is turned on, and the logical value of the node QC_N is set to '0'. The logical value of the node QC that has been '0' may be set to '1' obtained by inverting the logical value of the node QC_N. If the logical value of the second sensing node SO2 is '0', the sixth transistor T6 is turned off, and the second node N2 floats. Hence, the logical value of the node QC_N may remain at '1', and the logical value of the node QC may remain at '0'. In other words, since the logical value of the node QC is set to the same value as the logical value of the node QM by the cache latch set operation, the logical value of the node QM may be transmitted to the node QC.

In an embodiment, the latch control circuit LC may retain or interrupt the electrical connection between the bit line sensing circuit BLS and the main latch ML, in response to the first and second connection signals CON1 and CON2. The latch control circuit LC may retain or interrupt the electrical connection between the bit line sensing circuit BLS and the cache latch CL, in response to the first and second connection signals CON1 and CON2.

In response to the first and second connection signals CON1 and CON2, the latch control circuit LC may retain or interrupt the electrical connection between the bit line sensing circuit BLS and the main latch ML and retain or interrupt the electrical connection between the bit line sensing circuit BLS and the cache latch CL while some period of time of the bit line sensing operation and some period of time of the cache latch operation overlap with each other.

Figure 5B:
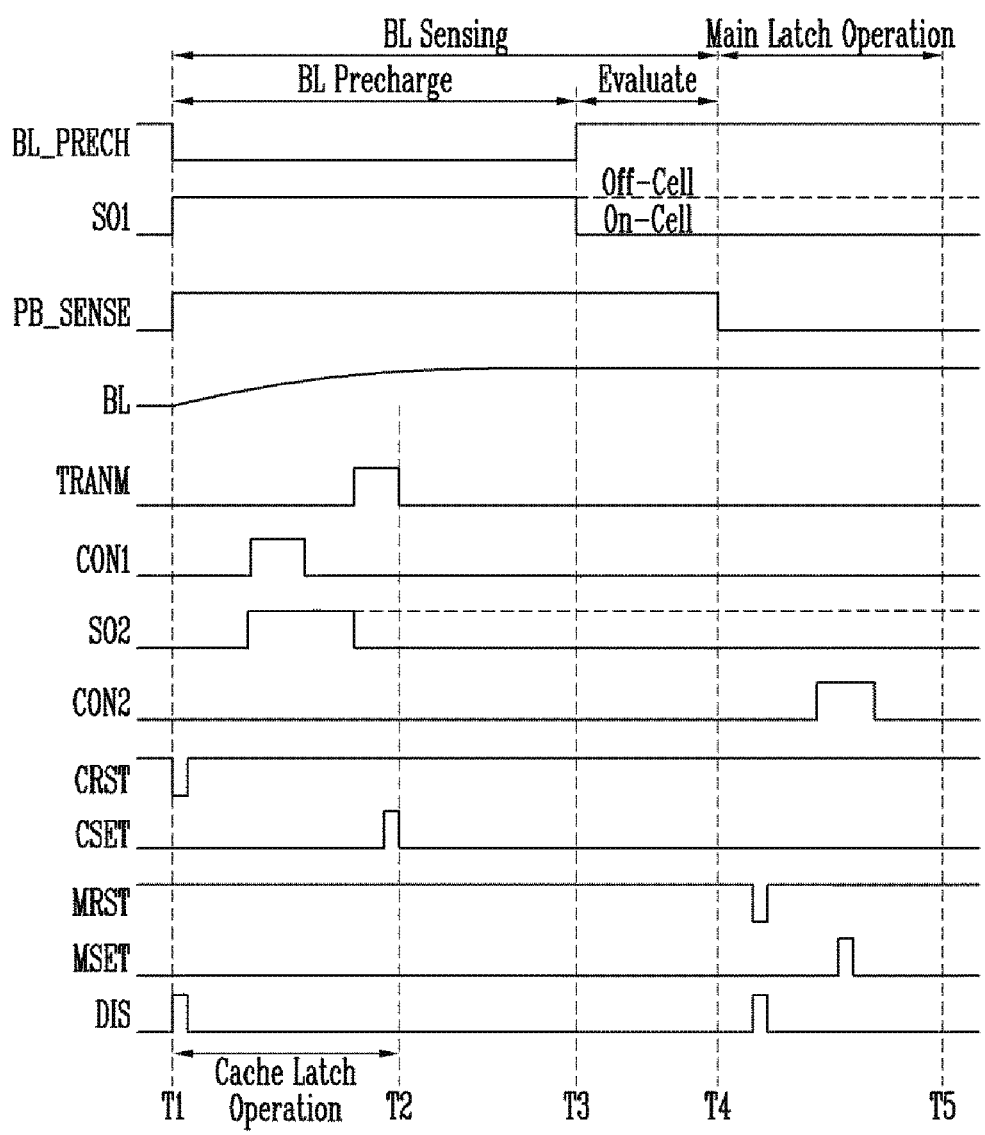
FIG. 5B is a timing diagram for describing an operation of a page buffer of FIG. 5A.

FIG. 5B is a timing diagram for describing an operation of the page buffer of FIG. 5A.

Referring to FIG. 5B, a data read operation may be performed during a period of time ranging from T1 to T5. The data read operation may include a bit line sensing operation and a main latch operation.

The bit line sensing operation may include a bit line pre-charge operation of pre-charging a bit line, and an evaluation operation of sensing data stored in a memory cell. The evaluation operation may be an operation of sensing data stored in the memory cell, based on the potential of the first sensing node SO1 that varies depending on bit line current. The bit line current may flow from the bit line to the memory cell string depending on whether the memory cell is an on-cell or an off-cell.

The main latch operation may be an operation of storing the sensed data in the main latch.

In FIG. 5B, while the bit line pre-charge operation is performed, the bit line pre-charge signal BL_PRECH and the page buffer control signal PB_SENSE may be enabled. Therefore, the potential of the first sensing node SO1 and the potential of the bit line BL may be pre-charged to the high level.

While the evaluation operation is performed, the bit line pre-charge signal BL_PRECH may be disabled, and the page buffer control signal PB_SENSE may be enabled. If the selected memory cell is an on-cell, bit line current may flow, and the potential of the first sensing node SO1 coupled with the bit line BL may be discharged from the high level to the low level. If the selected memory cell is an off-cell, bit line current might not flow, and the potential of the first sensing node SO1 coupled with the bit line BL may remain at the high level. As described with reference to FIG. 5A, since the capacitance of the bit line BL is much larger than that of the first sensing node SP1, a width by which the potential of the bit line BL is reduced by the bit line current is slight compared to a reduction width of the potential of the first sensing node SO1.

The main latch operation may include a main latch reset operation and a main latch set operation. During the main latch reset operation, the main latch reset signal MRST and the discharge signal DIS may be enabled, and the logical value of the node QM may be set to '0'. During the main latch set operation, the second connection signal CON2 and the main latch set signal MSET may be enabled, and the logical value of the first sensing node SO1 that is determined depending on the data sensed from the memory cell may be stored to the node QM.

The data transfer operation may be performed during a period of time ranging from time T1 to time T2. The data transfer operation may include a cache latch operation. The data output operation (not illustrated) may be performed during a period of time ranging from time T2 to time T5.

The cache latch operation may be an operation of receiving data stored in the main latch and storing the data in the cache latch. The data output operation may be an operation of outputting data stored in the cache latch to the external device provided outside the page buffer through the data line.

The cache latch operation may include a cache latch reset operation and a cache latch set operation. During the cache latch reset operation, the cache latch reset signal CRST and the discharge signal DIS may be enabled, and the logical value of the node QC may be set to '0'. During some period of the cache latch set operation, the first connection signal CON1 may be enabled, and the potential of the second sensing node SO2 coupled with the first sensing node 501 may be pre-charged to the high level. Thereafter, the main latch control signal TRANM and the cache latch set signal CSET may be enabled, and the logical value of the node QM may be stored in the node QC.

In an embodiment of the present disclosure, the bit line sensing operation and the cache latch operation may overlap with each other. Although FIG. 5B illustrates that the cache latch operation and the bit line sensing operation are simultaneously performed, either the cache latch operation or the bit line sensing operation may be first initiated, in various embodiments.

Although FIG. 5B illustrates that the cache latch operation overlaps with the bit line pre-charge operation during the bit line sensing operation, the cache latch operation may overlap with the evaluation operation during the bit line sensing operation in various embodiments.

Although FIG. 5B illustrates that the entire period of the cache latch operation overlaps with some period of the bit line sensing operation, some period of the cache latch operation may overlap with some period of the bit line sensing operation in various embodiments.

FIG. 6 is a diagram for describing the cache read operation in accordance with an embodiment.

Referring to FIG. 6, a data read operation for first data DATA1 may include a bit line sensing operation and a main latch operation for the first data DATA1. The data transfer operation for the first data DATA1 may include a cache latch operation for the first data DATA1. If the data transfer operation for the first data DATA1 is completed, a data output operation (not illustrated) of outputting the first data DATA1 to an external device may be performed.

The data read operation for second data DATA2 may include a bit line sensing operation and a main latch operation for the second data DATA2. The data transfer operation for the second data DATA2 may include a cache latch operation for the second data DATA2. If the data transfer operation for the second data DATA2 is completed, a data output operation (not illustrated) of outputting the second data DATA2 to an external device may be performed.

In the case of the conventional cache read operation, while the data output operation for the first data DATA1 is performed, the data read operation for the second data DATA2 may be performed overlapping with the data output operation for the first data DATA1. In other words, after the data transfer operation for the first data DATA1 has been completed, the data read operation for the second data DATA2 may be performed.

In the case of the cache read operation in accordance with an embodiment, some period of the data transfer operation for the first data DATA1 may overlap with some period of the data read operation for the second data DATA2. In other words, while the data transfer operation for the first data DATA1 is performed, the data read operation for the second data DATA2 may be initiated.

Therefore, in the case of the cache read operation in accordance with an embodiment, the read time is reduced by a period in which the data transfer operation for the first data DATA1 overlaps with the data read operation for the second data DATA2. Consequently, the performance of the cache read operation may be enhanced.

FIG. 7 is a flowchart for describing an operation of the page buffer in accordance with an embodiment.

Referring to FIG. 7, at step S701, the page buffer may perform a first bit line sensing operation which is a bit line sensing operation for first data.

At step S703, the page buffer may perform a first main latch operation which is a main latch operation for the first data.

At step S705, the page buffer may perform a first cache latch operation which is a cache latch operation for the first data.

At step S707, the page buffer may initiate a second bit line sensing operation which is a bit line sensing operation for second data, while the first cache latch operation is performed. The page buffer may perform the first cache latch operation and the second bit line sensing operation such that some period of time of the first cache latch operation overlaps with some period of time of the second bit line sensing operation. Step S705 and step S707 may be performed such that some periods thereof overlap with each other.

Figure 8:
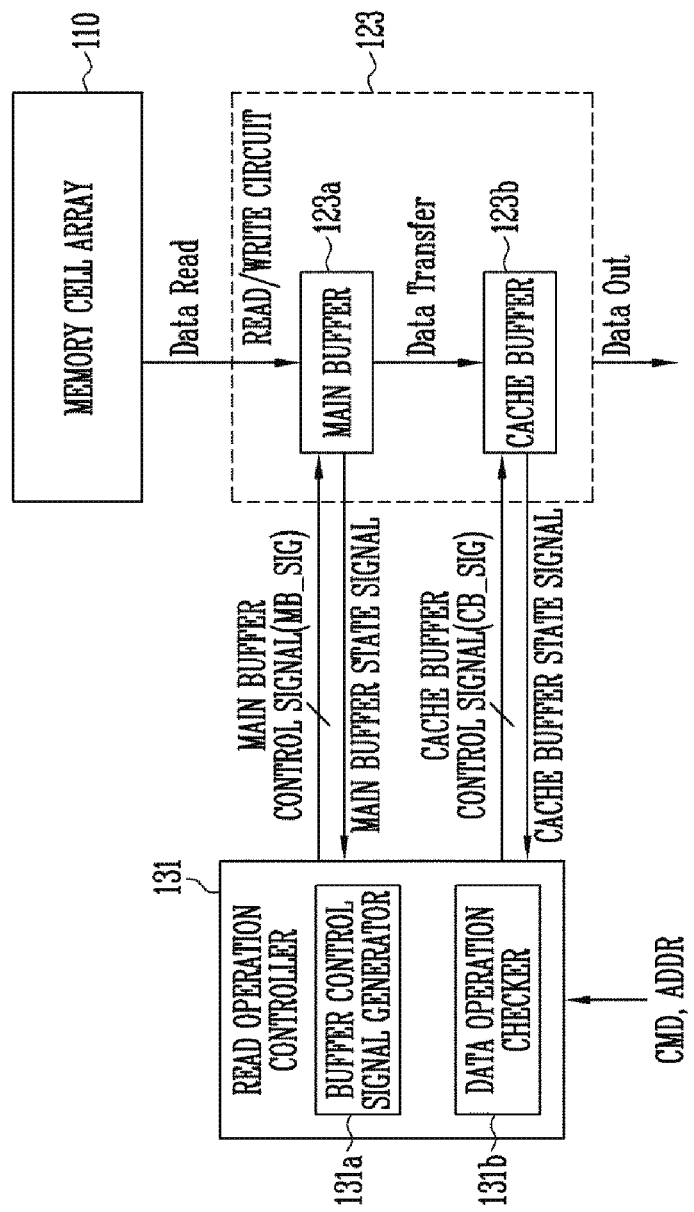
FIG. 8 is a diagram for describing an operation of a read operation controller of FIG. 2.

FIG. 8 is a diagram for describing an operation of the read operation controller of FIG. 2.

Referring to FIG. 8, the read/write circuit 123 described with reference to FIG. 2 may include the main buffer 123a and the cache buffer 123b. In an embodiment, the main buffer 123a may be called as a first buffer and the cache buffer 123b may be called as a second buffer.

The data read operation may be an operation of sensing data from the memory cell array 110 and storing the sensed data in the main buffer 123a. The data transfer operation may be an operation of transmitting the data stored in the main buffer 123a to the cache buffer 123b and storing the data in the cache buffer 123b. The data output operation may be an operation of outputting the data stored in the cache buffer 123b to an external device provided outside the read/write circuit 123.

The read operation controller 131 may control the main buffer 123a and the cache buffer 123b to perform a data read operation, a data transfer operation, and a data output operation in response to an input command CMD and an input address ADDR.

For example, the read operation controller 131 may control the main buffer 123a in response to a main buffer control signal MB_SIG, and control the cache buffer 123b in response to a cache buffer control signal CB_SIG.

The main buffer control signal MB_SIG may include at least one of the bit line pre-charge signal, the page buffer control signal, the first and second connection signals, the discharge signal, the main latch control signal, the main latch reset signal, and the main latch set signal that have been described with reference to FIG. 5A. The cache buffer control signal CB_SIG may include at least one of the cache latch control signal, the cache latch reset signal, or the cache latch set signal that have been described with reference to FIG. 5A.

In an embodiment, the read operation controller 131 may control the main buffer 123a to perform a first data read operation of storing, in the main buffer 123a, first data stored in the memory cell array 110, in response to a first read command. The read operation controller 131 may control the main buffer 123a and the cache buffer 123b to perform, in response to the first read command, a first data transfer operation of storing, in the cache buffer 123b, the first data stored in the main buffer 123a.

The read operation controller 131 may control the main buffer 123a to perform, in response to a second read command, a second data read operation of storing, in the main buffer 123a, second data stored in the memory cell array 110. The second data may be data different from the first data.

The read operation controller 131 may control the main buffer 123a and the cache buffer 123b such that some period of time of the first data transfer operation and some period of time of the second data read operation overlap with each other. The read operation controller 131 may control the main buffer 123a and the cache buffer 123b such that the second data read operation is initiated while the first data transfer operation is performed.

In an embodiment, the read operation controller 131 may include a buffer control signal generator 131a and a data operation checker 131b.

The buffer control signal generator 131a may control the main buffer 123a and the cache buffer 123b to perform a data read operation, a data transfer operation, and a data output operation in response to an input command CMD and an input address ADDR.

For example, if the read command is received, the buffer control signal generator 131a may provide a main buffer control signal MB_SIG to the main buffer 123a and provide a cache buffer control signal CB_SIG to the cache buffer 123b to perform the data read operation, the data transfer operation, and the data output operation.

The data operation checker 131b may receive, from the main buffer 123a, a main buffer state signal indicating that the operation of the main buffer 123a has been completed. The data operation checker 131b may receive, from the cache buffer 123b, a cache buffer state signal indicating that the operation of the cache buffer 123b has been completed.

The data operation checker 131b may generate data operation check information indicating whether each of the data read operation, the data transfer operation, and the data output operation that correspond to the read command has been completed, based on the main buffer state signal and the cache buffer state signal.

In an embodiment, when it is determined based on the data operation check information that the data read operation corresponding to the first read command is completed and the data transfer operation is initiated, the buffer control signal generator 131a may control the main buffer 123a and the cache buffer 123b such that the data read operation corresponding to the second read command is initiated.

Figure 9:
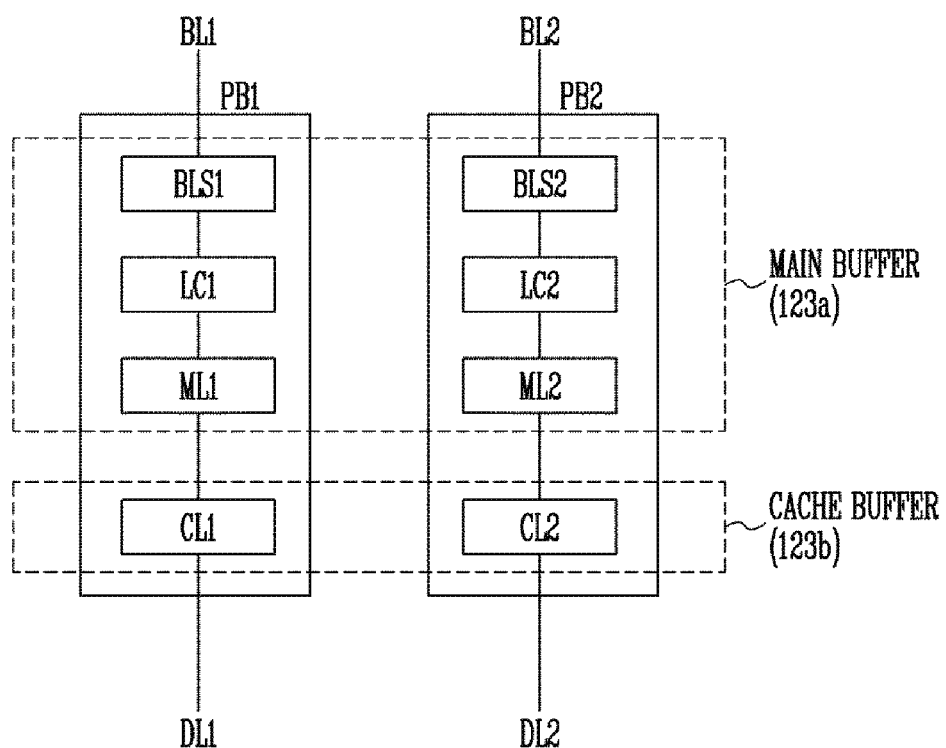
FIG. 9 is a diagram for describing the configuration of a main buffer and a cache buffer of FIG. 8.

FIG. 9 is a diagram for describing the configuration of the main buffer and the cache buffer of FIG. 8.

Referring to FIG. 9, the read/write circuit 123 may include the first page buffer PB1 and the second page buffer PB2. The number of page buffers included in the read/write circuit 123 is not limited to that of the present embodiments.

The first page buffer PB1 may include a first bit line sensing circuit BLS1, a first latch control circuit LC1, a first main latch ML1, and a first cache latch CL1. The first page buffer PB1 may output, through a first data line DL1, data sensed from a first memory cell through the first bit line BL1 coupled with the first memory cell.

The second page buffer PB2 may include a second bit line sensing circuit BLS2, a second latch control circuit LC2, a second main latch ML2, and a second cache latch CL2. The second page buffer PB2 may output, through a second data line DL2, data sensed from a second memory cell through the second bit line BL2 coupled with the second memory cell. The main buffer 123a may include the bit line sensing circuit, the latch control circuit, and the main latch of each of the plurality of page buffers PB1 and PB2. For example, the main buffer 123a may include the plurality of bit line sensing circuits BLS1 and BLS2, the plurality of latch control circuits LC1 and LC2, and the plurality of main latches ML1 and ML2.

The cache buffer 123b may include the cache latch of each of the plurality of page buffers PB1 and PB2. For example, the cache buffer 123b may include the plurality of cache latches CL1 and CL2.

Figure 10:
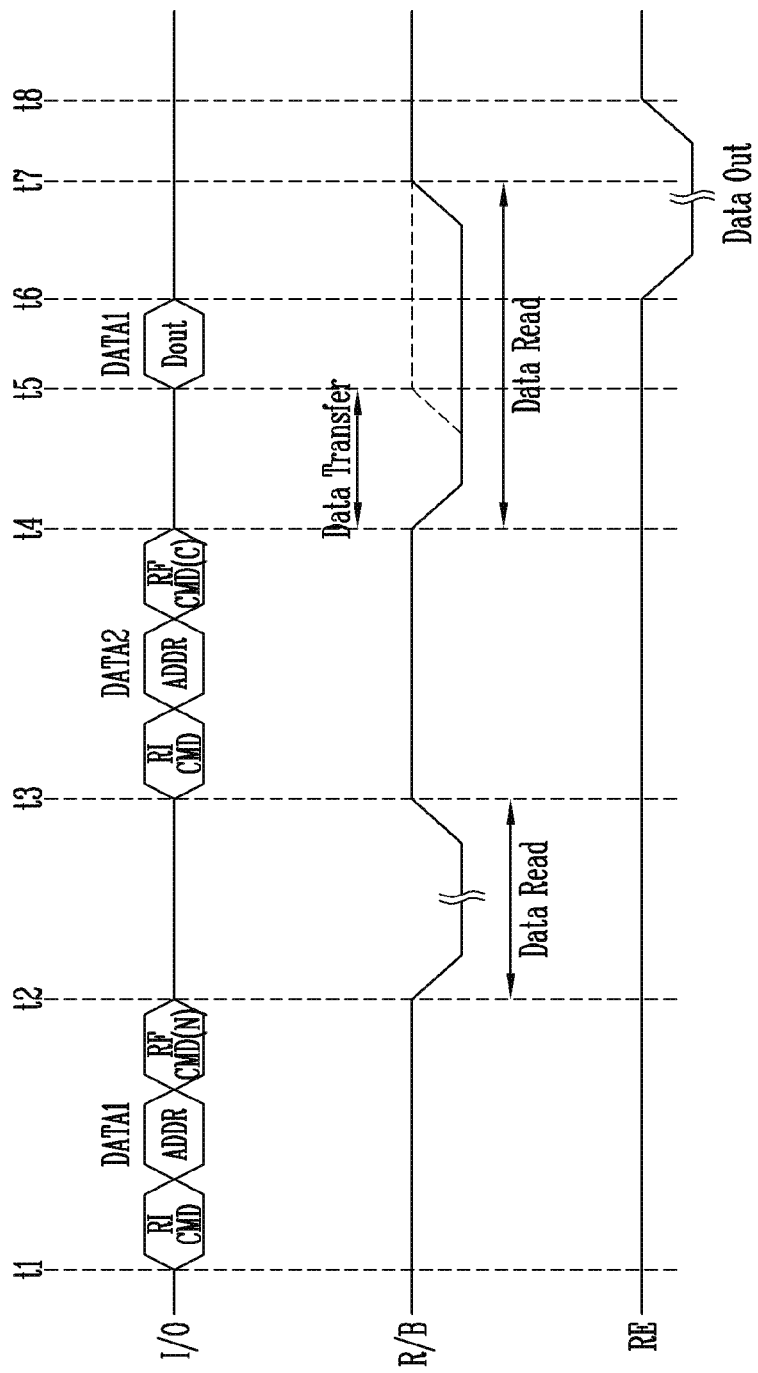
FIG. 10 is a timing diagram for describing a cache read operation in accordance with an embodiment.

FIG. 10 is a timing diagram for describing the cache read operation in accordance with an embodiment.

Referring to FIG. 10, the read command described with reference to FIG. 2 may include a read initiation command RI CMD and a read final command RF CMD. Depending on the type of read final command RF CMD, the memory device may perform a cache read operation or a normal read operation.

During a period ranging from time t1 to time t2, a read initiation command RI CMD, an address ADDR, a read final command RF CMD(N) for the first data DATA1 may be sequentially input to the memory device through an input/output line I/O.

During a period ranging from time t2 to time t3, the memory device may perform a data read operation for the first data DATA1 in response to the input read final command RF CMD(N). The data read operation for the first data DATA1 may be a normal read operation. While the data read operation for the first data DATA1 is performed, a ready/busy signal R/B may make a transition from high to low.

The ready/busy signal R/B may indicate whether the memory device is in a ready state or a busy state. If the ready/busy signal R/B has a high level, the memory device is in the ready state, so that the memory device may receive a new command from the memory controller to perform an operation. If the ready/busy signal R/B has a low level, the memory device is in the busy state, so that the memory device might not receive a new command from the memory controller because the memory device is performing an operation corresponding to a previously received command.

During a period ranging from time t3 to time t4, a read initiation command RI CMD, an address ADDR, a read final command RF CMD(C) for the second data DATA2 may be sequentially input to the memory device through the input/output line I/O.

During a period ranging from time t4 to t5, the memory device may perform a data transfer operation for the first data DATA1. After time t4, the memory device may initiate a data read operation for the second data DATA2 in response to the read final command RF CMD(C). The data read operation for the second data DATA2 may be a cache read operation. During a period ranging from time t4 to t7, the memory device may perform a data read operation for the second data DATA2.

During a period ranging from time t5 to time t6, a data output command Dout for the first data DATA1 may be input to the memory device through the input/output line I/O.

During a period ranging from time t6 to time t8, the memory device may perform a data output operation for the first data DATA1. While the data output operation for the first data DATA1 is performed, a read enable signal RE may make a transition from high to low.

The read enable signal RE may indicate whether the memory device is able to output the read data to an external device. If the read enable signal RE has a high level, the memory device might not output the read data to the external device. If the read enable signal RE has a low level, the memory device may output the read data to the external device.

In the case of a conventional cache read operation, the memory device is not able to perform the data read operation for the second data DATA2 before the data transfer operation for the first data DATA1 is completed, In other words, after time t5, the memory device may initiate the data read operation for the second data DATA2 in response to the read final command RF CMD(C).

In the case of the cache read operation in accordance with an embodiment of the present disclosure, the memory device may perform the data transfer operation for the first data DATA1 and the data read operation for the second data DATA2 in such a way that some period of time of the data transfer operation for the first data DATA1 overlaps with some period of time of the data read operation for the second data DATA2. In other words, after time t4, the memory device may initiate the data read operation for the second data DATA2 in response to the read final command RF CMD(C).

Thus, the time it takes to perform the cache read operation is reduced by the period (from t4 to t5) in which the data transfer operation for the first data DATA1 overlaps with the data read operation for the second data DATA2. Consequently, the performance of the cache read operation may be enhanced.

Figure 11:
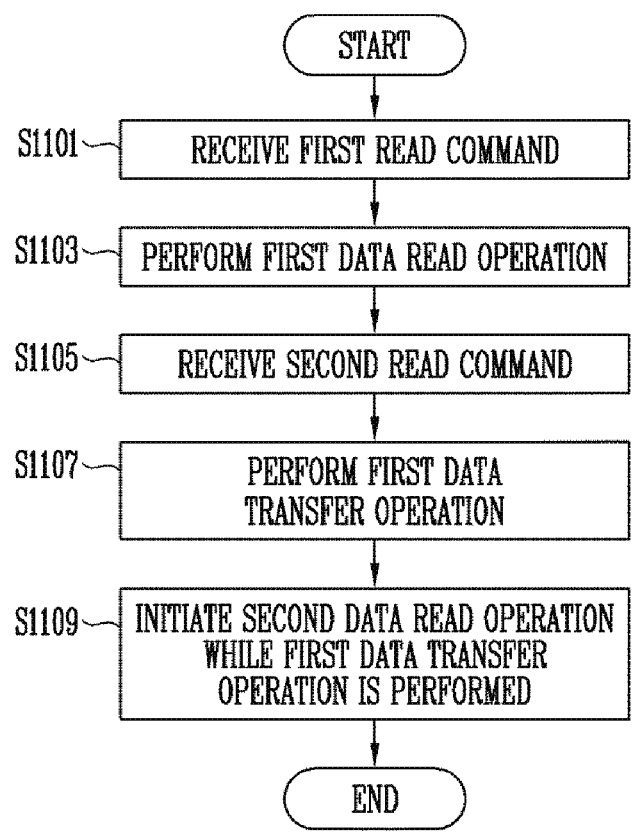
FIG. 11 is a diagram for describing an operation of the memory device in accordance with an embodiment.

FIG. 11 is a diagram for describing an operation of the memory device in accordance with an embodiment.

Referring to FIG. 11, at step S1101, the memory device may receive a first read command. The first read command may be a read command for first data.

At step S1103, the memory device may perform a data read operation for the first data in response to the first read command. The data read operation for the first data may be an operation of sensing the first data stored in first memory cells, and storing the sensed first data in the main buffer.

At step S1105, the memory device may receive a second read command. The second read command may be a read command for second data. The second data may differ from the first data.

At step S1107, the memory device may perform a data transfer operation for the first data in response to the first read command. The data transfer operation for the first data may be an operation of transmitting the first data stored in the main buffer to the cache buffer, and storing the first data in the cache buffer.

At step S1109, the memory device may perform a data read operation for the second data in response to the second read command while the data transfer operation for the first data is performed. The data read operation for the second data may be an operation of sensing the second data stored in second memory cells, and storing the sensed second data in the main buffer. Step S1107 and step S1109 may be performed such that some periods thereof overlap with each other.

As described above, various embodiments of the present disclosure may provide a memory device having improved cache read performance, and a method of operating the memory device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A page buffer coupled to a memory cell, the page buffer comprising:
    a bit line sensing circuit coupled with the memory cell through a bit line and configured to perform a bit line sensing operation of sensing first data stored in the memory cell;
    a latch control circuit coupled with the bit line sensing circuit;
    a main latch coupled with the bit line sensing circuit through the latch control circuit and configured to perform a main latch operation of storing the sensed first data; and
    a cache latch coupled with the main latch and configured to perform a cache latch operation of storing second data that is different from the first data and received from the main latch,
    wherein the latch control circuit controls connection of the bit line sensing circuit with the main latch so that a period of time of the cache latch operation overlaps with a period of time of the bit line sensing operation.

2. The page buffer according to claim 1, wherein the second data is data stored in the main latch before the bit line sensing operation of sensing the first data stored in the memory cell.

3. The page buffer according to claim 1, wherein the bit line sensing circuit initiates the bit line sensing operation while the cache latch operation of storing, in the cache latch, the second data stored in the main latch is performed.

4. The page buffer according to claim 3, wherein the main latch performs the main latch operation when the bit line sensing operation is completed.

5. The page buffer according to claim 1, wherein the latch control circuit interrupts the connection of the bit line sensing circuit with the main latch when the bit line sensing and the cache latch operations are being performed, and retains the connection of the bit line sensing circuit with the main latch when the cache latch operation has completed.

6. The page buffer according to claim 1, wherein the latch control circuit comprises:
    a first switch coupled between a first sensing node and a second sensing node; and
    a second switch coupled between a first node and a second node,
    wherein the bit line sensing circuit is coupled between the first sensing node and the first node, and
    wherein the main latch and the cache latch are coupled between the second sensing node and the second node.

7. The page buffer according to claim 6, wherein the latch control circuit turns on the first switch during some period of the cache latch operation, and turns off the second switch during an entire period of the cache latch operation.

8. The page buffer according to claim 6, wherein the latch control circuit turns on the second switch during some period of time of the main latch operation.

9. The page buffer according to claim 6,
    wherein the latch control circuit further comprises a third switch and a fourth switch each coupled between a ground terminal and the second node,
    wherein the third switch is controlled by potential of the second sensing node, and
    wherein the fourth switch is controlled by a discharge signal for resetting the main latch or the cache latch.

10. A memory device comprising:
    a memory cell array including a plurality of memory cells;
    a first buffer configured to sense and store data stored in the plurality of memory cells;
    a second buffer configured to store data transmitted from the first buffer; and
    a read operation controller configured to control the first buffer to perform a data read operation of sensing and storing first data stored in first memory cells among the plurality of memory cells, and control the first buffer and the second buffer such that a period of time of the data read operation overlaps with a period of time of a data transfer operation,
    wherein the data transfer operation stores, in the second buffer, second data that is different from the first data and received from the first buffer.

11. The memory device according to claim 10, wherein the read operation controller controls the first buffer to initiate the data read operation while the data transfer operation is performed.

12. The memory device according to claim 11, wherein the data read operation includes a bit line sensing operation of sensing the first data stored in the first memory cells, and a main latch operation of storing the sensed first data in the first buffer.

13. The memory device according to claim 12, wherein the read operation controller controls the first buffer to initiate the bit line sensing operation while the data transfer operation is performed.

14. The memory device according to claim 10, wherein the second data comprises data obtained by sensing data stored in second memory cells different from the first memory cells among the plurality of memory cells.

15. The memory device according to claim 10,
wherein the first buffer comprises a main buffer coupled with the plurality of memory cells by a plurality of bit lines, and
wherein the second buffer comprises a cache buffer coupled with the main buffer.

16. The memory device according to claim 15, wherein the main buffer comprises:
a plurality of bit line sensing circuits coupled with the plurality of memory cells by the plurality of bit lines, and configured to sense data stored in the plurality of memory cells;
a plurality of latch control circuits respectively coupled with the plurality of bit line sensing circuits; and
a plurality of main latches respectively coupled with the plurality of bit line sensing circuits through the plurality of latch control circuits, and configured to store data sensed by the plurality of bit line sensing circuit,
wherein the cache buffer comprises a plurality of cache latches respectively coupled with the plurality of main latches and configured to store data transmitted from the plurality of main latches.

17. The memory device according to claim 16, wherein the read operation controller controls the plurality of latch control circuits to interrupt connection between the plurality of bit line sensing circuits and the plurality of main latches during some period of time in which the data transfer operation overlaps with the data read operation.

18. A memory device comprising:
a memory cell array including a plurality of memory cells;
a first buffer configured to sense and store data stored in the plurality of memory cells;
a second buffer configured to store data transmitted from the first buffer; and
a read operation controller configured to control the first buffer and the second buffer to perform a first data read operation and a first data transfer operation in response to a first read command, and to perform a second data read operation in response to a second read command,
wherein the first data read operation stores first data stored in first memory cells among the plurality of memory cells in the first buffer,
wherein the first transfer operation stores the first data stored in the first buffer in the second buffer,
wherein the second data read operation stores second data stored in second memory cells among the plurality of memory cells in the first buffer, and
wherein some period of time of the first data transfer operation overlaps with some period of time of the second data read operation.

19. The memory device according to claim 18, wherein the read operation controller controls the first buffer and the second buffer to initiate the second data read operation while the first data transfer operation is performed.

20. The memory device according to claim 18, wherein the read operation controller controls the second buffer to perform, in response to a first data output command, a first data output operation of outputting the first data stored in the second buffer to an external device after the first data transfer operation has been completed.

21. The memory device according to claim 20, wherein the second read command comprises a cache read command for instructing to perform the first data output operation and the second data read operation in such a way that some period of time of the first data output operation overlaps with some period of time of the second data read operation.

* * * * *